United States Patent [19]

Yonezu

[11] E Re. 29,866

[45] Reissued Dec. 19, 1978

[54] DOUBLE HETEROSTRUCTURE STRIPE GEOMETRY SEMICONDUCTOR LASER DEVICE

[75] Inventor: Hiroo Yonezu, Tokyo, Japan

[73] Assignee: Nippon Electric Company, Limited, Tokyo, Japan

[21] Appl. No.: 878,187

[22] Filed: Feb. 14, 1978

Related U.S. Patent Documents

Reissue of:

[64] Patent No.: 3,993,964
Issued: Nov. 23, 1976
Appl. No.: 605,550
Filed: Aug. 18, 1975

U.S. Applications:

[60] Division of Ser. No. 492,262, Jul. 26, 1974, which is a continuation of Ser. No. 413,923, Nov. 8, 1973, abandoned, which is a continuation of Ser. No. 267,068, Jun. 28, 1972, abandoned.

[30] Foreign Application Priority Data

Jul. 30, 1971 [JP] Japan ..... 46-57665

[51] Int. Cl.[2] ..... H01S 3/19

[52] U.S. Cl. ..... 331/94.5 H; 357/16; 357/18

[58] Field of Search ..... 331/94.5 H; 357/16–18; 330/4.3

[56] References Cited

U.S. PATENT DOCUMENTS

| | | | |
|---|---|---|---|
| 3,354,406 | 11/1967 | Kiss | 331/94.5 H |
| 3,363,195 | 1/1968 | Furnange et al. | 331/94.5 H |
| 3,479,613 | 11/1969 | Ruprecht et al. | 331/94.5 H |
| 3,495,140 | 2/1970 | Cornely et al. | 331/94.5 H |
| 3,522,552 | 8/1970 | Wilmett | 331/94.5 H |
| 3,758,875 | 9/1973 | Hayashi | 331/94.5 H |
| 3,780,358 | 12/1973 | Thompson | 331/94.5 H |
| 3,783,351 | 1/1974 | Tsukada et al. | 331/94.5 H |

*Primary Examiner*—Stanley D. Miller, Jr.
*Assistant Examiner*—James W. Davie
*Attorney, Agent, or Firm*—Hopgood, Calimafde, Kalil, Blaustein & Lieberman

[57] ABSTRACT

A semiconductor laser device includes a narrow elongated semiconductor region of the same conductivity type as another semiconductor region lying in the vicinity of the active region of the laser device. The elongated region extends in depth from the surface of the device to the vicinity of the active region. A surface semiconductor layer of an opposite conductivity type covers the entire surface of the device except for the elongated region.

1 Claim, 4 Drawing Figures

DOUBLE HETEROSTRUCTURE STRIPE GEOMETRY SEMICONDUCTOR LASER DEVICE

Matter enclosed in heavy brackets [ ] appears in the original patent but forms no part of this reissue specification; matter printed in italics indicates the additions made by reissue.

This is a divisional of application Ser. No. 492,262 filed July 26, 1974 which was a continuation of Ser. No. 413,923 filed Nov. 8, 1973, now abandoned, which was a continuation of Ser. No. 267,068, filed June 28, 1972, now abandoned.

The present invention relates generally to lasers, and more particularly to semiconductor lasers.

In recent years, semiconductor lasers capable of continuous oscillation at room temperature have been developed. This has created a problem of adapting these lasers to practical use. One of the solutions to this problem that has been heretofore proposed is the so-called stripe construction type device which has a surface covered with an $SiO_2$ film that serves an an electrical and thermal insulator, and a stripe-shaped opening for forming an electrode to permit electrical current amd heat to pass therethrough.

In general, the active region of this prior art semiconductor device lies at a depth of at least 2 microns from the surface of the device. This tends to cause the current at the active region to spread beyond 10 microns, particularly when the width of the stripe electrode is made smaller than 10 microns. As a result, the laser oscillation is difficult to maintain and the heat radiation is deteriorated due to the $SiO_2$ film covering the substrate. A more serious disadvantage in this prior art device is that the current flow at the active region becomes larger in width than the strip electrode making it difficult to achieve adequate oscillation mode control of the laser.

It is an object of the present invention to provide a semiconductor laser device adapted to maintain the width of the active region at a value approximately equal to or less than that of a stripe electrode, and thereby to facilitate heat radiation and oscillation mode control.

It is a further object of the present invention to provide a semiconductor laser device in which a narrow current flowing active region can be realized.

According to the present invention, there is provided a semiconductor laser device which comprises a narrow, elongated region of a conducitivity type identical to that of another region lying in the vicinity of the active region of the laser device. The elongated region extends in depth from the surface of the device to the vicinity of the active region and lying perpendicular to a pair of reflective surfaces extending therebetween. A surface layer having a conductivity type opposite to that of the elongated region covers the entire surface of the device except for the narrow, elongated region. A metal electrode covers at least the narrow, elongated region.

The semiconductor device of the present invention is based on the fact that the reverse biasing of a p-n junction is utilized for producing electrical oscillation, with a limited part thereof left forward biased to permit laser oscillation. Heat generated at the limited part is allowed to be radiated from the entire area of the p-n junction and the substrate. To take a GaAs - $Ga_xAl_{1-x}As$ double hetero-junction laser as an example, the GaAs active region of approximately 0.5 micron in thickness is sandwiched between p-type and n-type layers of $Ga_xAl_{1-x}As$. Assuming that the layer closer to the surface is of p-type, it is approximately 1 micron thick, and a p-type GaAs layer of approximately 1 to 2 microns in thickness is further formed on the surface of the p-type laser so as to facilitate the provision of an ohmic contact layer forming an electrode. This is a typical layer construction of the well-known double hetero-junction laser.

In accordance with the present invention, the surface layer of the p-type GaAs is not of p-type but of n-type, with a part thereof converted into a narrow elongated p-type region down at least to the second layer. An ohmic electrode is then formed over the entire surface of the layer irrespective of its conductivity type. The current is allowed to flow, with the ohmic electrode as the positive electrode, through the narrow elongated p-type region, the p-type GaAs layer, the p-type $Ga_xAl_{1-x}As$ layer, the GaAs layer (the active region), the n-type $Ga_xAl_{1-x}As$ layer, and the n-type GaAs substrate, to the electrode on the opposite side. Irrespective of whether the active region is of the p-type or n-type, the current flows from the p-type to the n-type regions as a result of the forward biasing. In the surface layer, however, almost the entire area of the n-type region of the surface GaAs layer is reverse biased except for the narrow, elongated p-type region. This serves to limit the current within the p-type region, because the immediately underlying layer is the p-type $Ga_xAl_{1-x}As$ layer. The current flowing from the ohmic electrode is thus permitted to flow only through the area defined by the narrow, elongated p-type region. As a result, the width of the active region is kept comparable to the width of the p-type region, leaving the possibility of the spread of the current only at the p-type $Ga_xAl_{1-x}As$ layer having a thickness of about 1 micron.

In the conventional device of the stripe-type construction, the ohmic electrode may be narrow, so as to limit the width of the current flowing at the active region. Between the ohmic electrode and the active region, however, there are the 2-micron-thick p-type GaAs layer and the 1-micron-thick p-type $Ga_xAl_{1-x}As$ layer. These layers of 3 microns in total thickness permit the current flow to spread before it reaches the active region. The spread becomes far more than negligible, particularly when the stripe electrode is made less than 10 microns.

In contrast, with the structure of the present invention, the current is not allowed to spread at the active region even when the stripe electrode is narrowed down to about 2 to 3 microns. This makes it possible to realize an extremely narrow, elongated current flowing region, which facilitates efficient oscillation and strict mode locking. Moreover, since the n-type surface layer need not be covered with a $SiO_2$ film, which is indispensable to the conventional device and deteriorates heat conduction and radiation, higher heat radiation efficiency can be achieved by bringing the surface region in direct contact with a radiator plate such as one made of diamond or copper. More specifically, the thermal resistance at the surface of the n-type surface layer of this structure is 40 percent lower than that of the $SiO_2$-covered conventional structure. This facilitates the maintenance of continuous laser oscillation at room temperature.

To the accomplishment of the above and to such further objects as may hereinafter appear, the present invention relates to a semiconductor laser device, substantially as defined in the appended claims and as described in the following specification taken together with the accompanying drawings in which:

Figure 1:
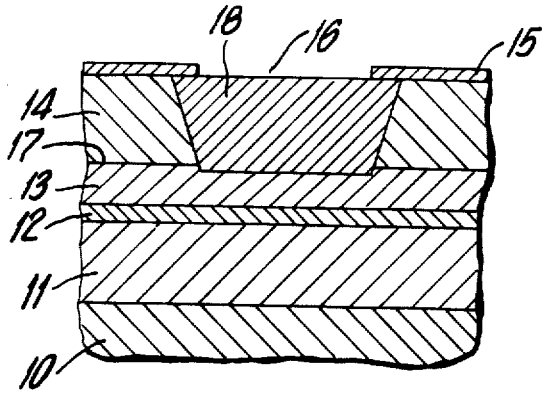
FIG. 1 is a partial vertical cross-sectional view of a semiconductor laser device according to one embodiment of the invention.
Figure 2:
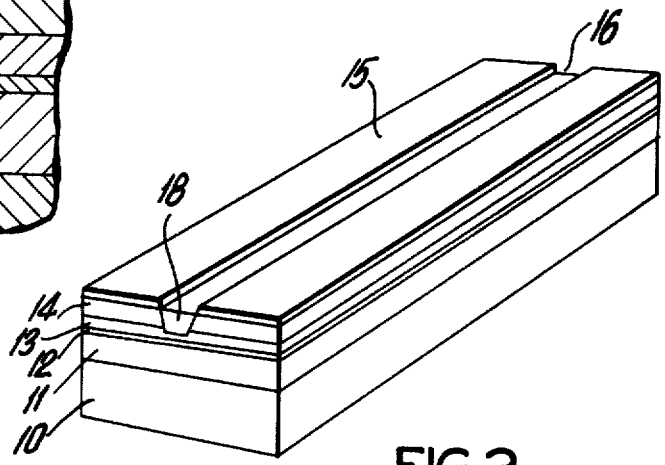
FIG. 2 is a perspective view of the semiconductor laser device of FIG. 1.

In the embodiment of the invention illustrated in FIGS. 1 and 2, double-hetero-junctions are formed on an n-type GaAs substrate 10 by the use of liquid growth and selective diffusion techniques. A p-type GaAs active region 12 of approximately 0.5 micron in thickness is formed between a 3 micron thick n-type $Ga_{0.7}Al_{0.3}As$ layer 11 and a 1 micron thick p-type $Ga_{0.7}Al_{0.3}As$ layer 13.

A 2 micron thick n-type GaAs surface layer 14 is then formed on the surface of layer 13. A stripe-shaped opening 16 of a width of 5 microns is formed by a known photoetching process in an $SiO_2$ film 15 covering layer 14. Zn is selectively diffused through opening 16 to a depth of approximately 2.2 microns, to wit, to a level slightly deeper than the boundary 17 between p-type $Ga_{0.7}Al_{0.3}As$ layer 13 and n-type GaAs layer 14. As a result, a narrow, elongated p-type GaAs layer 18 of a width of approximately 5 microns is formed from opening 16 to boundary 17.

Figure 3:
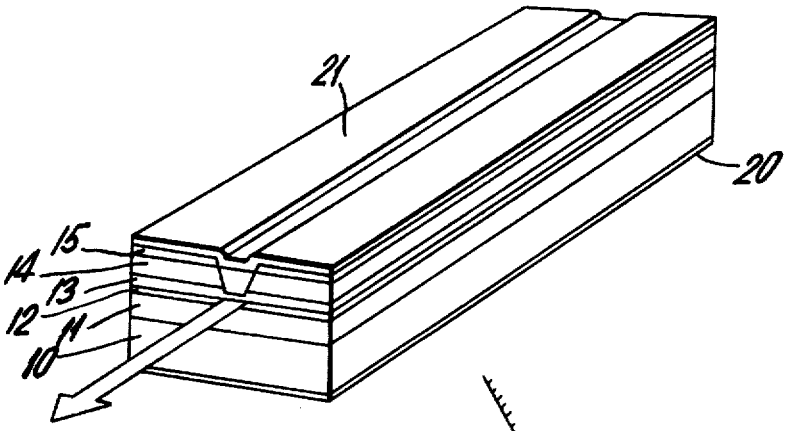
FIG. 3 is a perspective view of a laser device according to a modification of the embodiment of FIGS. 1 and 2.

FIG. 3 is a similar perspective view of the embodiment of FIGS. 1 and 2 in which an ohmic electode film 19 is formed covering the entire surface of $SiO_2$ film 15 and p-type elongated region 13 An ohmic electrode 20 is formed on the lower surface of substrate 10.

Figure 4:
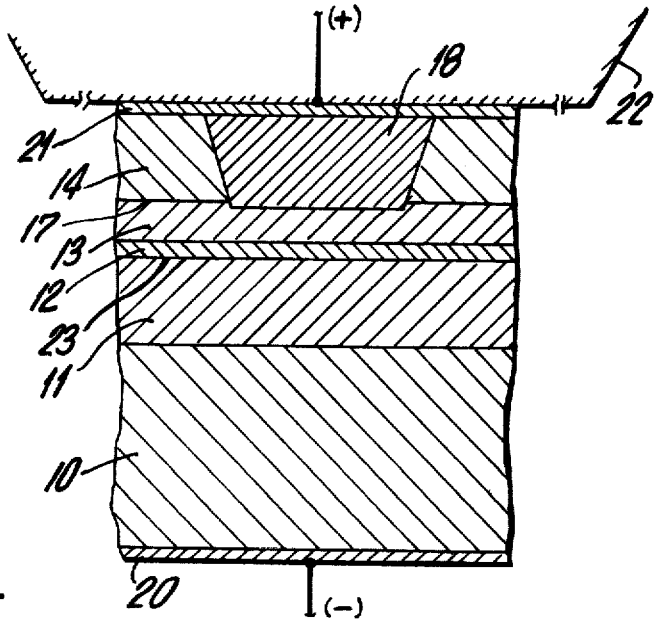
FIG. 4 is a partial cross-sectional view of a semiconductor laser device according to an alternate embodiment of the invention.

In the embodiment of the invention of FIG. 4, in which corresponding portions are designated by corresponding reference numerals, the $SiO_2$ film of the previously described embodiment is removed with fluoric acid, and an ohmic electrode 21 is provided over the entire surface of layer 14 and GaAs layer 18. Ohmic electrode 21 is kept in firm contact with a heat sink 22 which serves also an electrode. When heat sink electrode 22 is connected to the positive terminal of a power supply (not shown), and an ohmic electrode 20 on the lower surface of substrate 10 is coupled to a negative power supply terminal, current is caused to flow through the ohmic electrode 21, the narrow and elongated p-type GaAs layer 18, p-type $Ga_{0.7}Al_{0.3}As$ layer 13, p-type GaAs active region 12, n-type $Ga_{0.7}Al_{0.3}As$ layer 11, n-type GaAs substrate 10, and electrode 20, since the boundary 23, between p-type GaAs active region 12 and n-type $Ga_{0.7}Al_{0.3}As$ layer 11 is forward biased. The applied voltage is about 1.5V.

Under this state, boundary 17 between n-type GaAs layer 14 and p-type $Ga_{0.7}Al_{0.3}As$ layer 13 is reverse biased over the entire area except at the portion where p-type GaAs layer 18 is formed, thereby preventing the current flow. In the case of a carrier concentration of $5 \times 10^{17} cm^{-3}$, in both layers 13 and 14, the current prevention function is not affected even when the applied voltage is 50 volts. The current might tend to spread between p-type $Ga_{0.7}Al_{0.3}As$ layer 13 after passing through p-type GaAs layer 18 of a width of approximately 5 microns. Since, however, p-type $Ga_{0.7}Al_{0.3}As$ layer 13 is as thin as 1 micron, about 90 percent of the current is limited in its flow within the 5-micron-wide active region 12. This is in clear contrast to the case of the conventional stripe-electrode type device, wherein 90 percent of the current flow spreads to a width of approximately 12 microns at the active region even if the current flow is only 5 micron wide at the surface. Heat generated at the 5 micron wide area of active region 12 is permitted to radiate through the whole area of the ohmic electrode 21 by the heat sink 22. This keeps the temperature rise of the active region within 10° C when the current is 30 mA. In contrast, the temperature rise is as high as 16° C in a conventional stripe-electrode type device.

Experimental results show that the number of oscillation modes for the ocillation starting current density of approximately 2 $kA/cm^2$ is decreased at about one half of that for the conventional stripe-type device of a 12.5 micron wide electrode. Needless to say, the narrow and elongated p-type region 18 should be perpendicular to a pair of reflective surfaces and extend across the reflective surfaces. In the embodiment of the invention herein specifically shown, the distance between the reflection surfaces is approximately 300 microns.

Although a description of the present invention has been herein given referring to the embodiments shown, it will be clearly understood that these embodiments are given merely by way of example. The conductivity types of the layers 14 and region 18 are not limited to those herein described, so long as reverse biasing is achieved at the narrow and elongated portion. Also so far as the laser oscillation is not affected, the region 18 need not extend to the end surfaces of the region 13. Needless to say, the impurity concentration at the abovementioned portion should not be so high as to form a junction having the tunnel effect. The width of this portion extending from the surface toward the active region 12 need not be 5 microns and the selective diffusion method employed for the manufacture of the present device may be replaced with a selective crystal growing method. The crystal materials are not restricted to the above mentioned ones. The construction need not be the double hetero-junction, but may be a non-hetero-junction structure in which a high concentration, p-type GaAs active region lies between low concentration n-type and p-type GaAs layers. Also, the principle of the invention may be applied to a single hetero-junction laser. As a modification of the embodiment of FIG. 4, another thin layer of the same conductivity type as the narrow elongated area may be formed over the entire area of layer 14 and region 18 to reduce the resistance of the device as a whole.

Thus, whereas the invention has been described with respect to preferred embodiments thereof, it will be apparent that variations may be made therein, all without departing from the spirit and scope of the invention.

I claim:

1. A GaAs-$Al_xGa_{1-x}As$ double heterostructure injection laser comprising an N-type GaAs substrate, a first layer made of N-type $Al_xGa_{1-x}As$ epitaxially grown on one major surface of said substrate, a second layer made of GaAs epitaxially grown on said first layer, a third layer made of P-type $Al_2Ga_{1-x}As$ epitaxially grown on said second layer, a fourth layer made of N-type GaAs epitaxially grown on said third layer, a silicon dioxide film formed on said fourth layer and having a stripe-shaped opening formed therein, and a thin elongated P-type region formed on the surface of said [forth] *fourth* layer through the selective diffusion of P-type impurities through said stripe-shaped opening and into said fourth layer and extending past the junction between said third and fourth layers and into a portion of said third layer, a first electrode covering said silicon dioxide film and said [elongaged] *elongated* region, and a second electrode in ohmic contact with the other major surface of said substrate; wherein excitation current supplied through said first electrode is allowed to flow substantially only through the deepest portion of said thin elongated p-type region as the result of a reverse bias developed between said third and fourth layers.

* * * * *